(12) United States Patent
Yanagisawa

(10) Patent No.: US 11,585,829 B2
(45) Date of Patent: Feb. 21, 2023

(54) PHYSICAL QUANTITY SENSOR, ELECTRONIC APPARATUS, AND VEHICLE

(71) Applicant: SEIKO EPSON CORPORATION, Tokyo (JP)

(72) Inventor: Yoshinao Yanagisawa, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 314 days.

(21) Appl. No.: 17/083,780

(22) Filed: Oct. 29, 2020

(65) Prior Publication Data

US 2021/0132128 A1 May 6, 2021

(30) Foreign Application Priority Data

Oct. 31, 2019 (JP) .............................. JP2019-198125

(51) Int. Cl.
  *G01P 15/125* (2006.01)
  *G06F 3/044* (2006.01)
  *G01R 27/26* (2006.01)

(52) U.S. Cl.
  CPC ........ *G01P 15/125* (2013.01); *G01R 27/2605* (2013.01); *G06F 3/044* (2013.01)

(58) Field of Classification Search
  CPC ... G01P 15/125; G01P 21/00; G01R 27/2605; G06F 3/044
  See application file for complete search history.

(56) References Cited

U.S. PATENT DOCUMENTS

| 2008/0191714 A1 | 8/2008 | Masuda et al. |
| 2012/0056630 A1* | 3/2012 | Itou ........................ G01P 15/125 |
| | | 324/679 |

FOREIGN PATENT DOCUMENTS

| JP | 2008-196865 | 8/2008 |
| JP | 2009-019898 | 1/2009 |
| JP | 2010-133806 | 6/2010 |

* cited by examiner

*Primary Examiner* — Amy He
(74) *Attorney, Agent, or Firm* — Rankin, Hill & Clark LLP

(57) ABSTRACT

A physical quantity sensor includes a first element section in which first capacitances varying in accordance with a physical quantity have first saturation capacitance values at which the first capacitances are saturated by a first physical quantity, a second element section in which a second capacitances varying in accordance with the physical quantity have second saturation capacitance values at which the second capacitances are saturated by a second physical quantity smaller in absolute value than the first physical quantity, a multiplexer for outputting the first signals from the first element section and the second signals from the second element section, and a determination circuit that determines whether or not the level of the second signal input via the multiplexer reaches a threshold value which is a level of the second signal when the second physical quantity acts.

12 Claims, 11 Drawing Sheets

PHYSICAL QUANTITY SENSOR, ELECTRONIC APPARATUS, AND VEHICLE

The present application is based on, and claims priority from JP Application Serial Number 2019-198125, filed Oct. 31, 2019, the disclosure of which is hereby incorporated by reference herein in its entirety.

BACKGROUND

1. Technical Field

The present disclosure relates to a physical quantity sensor, an electronic apparatus, a vehicle, and so on.

2. Related Art

In recent years, there has been developed a capacitance type physical quantity sensor which detects a physical quantity using the phenomenon that the capacitance value of the capacitance generated between electrodes opposed to each other and provided to a physical quantity detection element changes in accordance with the magnitude and the direction of the physical quantity (acceleration, angular velocity, or the like). For example, there have widely been known a capacitance type acceleration sensor and a capacitance type angular velocity sensor using the silicon MEMS (Micro Electro-Mechanical Systems) technology.

In such a capacitance type physical quantity sensor, for example, when stiction occurs between the electrodes opposed to each other, the capacitance becomes extremely high, and therefore, as a result, the physical quantity detection element always outputs a detection signal which seems as if high acceleration is applied. Further, for example, when an interconnection through which the detection signal propagates is broken, the physical quantity detection element always outputs the detection signal which seems as if no acceleration is applied as a result. Therefore, when it is unachievable to immediately detect such a malfunction of the physical quantity detection element, there is a possibility that there occurs a malfunction in an external device which performs a process based on the physical quantity signal output from the physical quantity sensor.

In contrast, in JP-A-2009-19898, there is described (in Claim 5) a method of providing a stopped state determination unit for determining whether or not a vehicle is in a stopped state, and determining whether or not an output of an acceleration detection element is abnormal only when it is determined by the stopped state determination unit that the vehicle is in the stopped state.

However, since the abnormality determination by the physical quantity sensor is performed only when it is determined that the vehicle is in the stopped state, there is a concern that the abnormality determination is not performed for a relatively long period of time unless the vehicle is stopped due to a traffic condition such as a traffic light, a judgment by the driver, or the like.

SUMMARY

An aspect of the present disclosure relates to a physical quantity sensor including a first element section which includes a first capacitance varying in accordance with a physical quantity, and in which the first capacitance has a first saturation capacitance value at which the first capacitance is saturated by a first physical quantity, a second element section which includes a second capacitance varying in accordance with the physical quantity, and in which the second capacitance has a second saturation capacitance value at which the second capacitance is saturated by a second physical quantity smaller in absolute value than the first physical quantity, a drive circuit configured to output a drive signal to the first element section and the second element section, a multiplexer configured to output a first signal from the first element section and a second signal from the second element section in a time-sharing manner, and a determination circuit configured to use a level of the second signal when the second physical quantity acts as a threshold value to determine whether or not a level of the second signal input via the multiplexer reaches the threshold value.

DESCRIPTION OF EXEMPLARY EMBODIMENTS

The present embodiment will hereinafter be described. It should be noted that the present embodiment described below does not unreasonably limit the contents set forth in the appended claims. Further, all of the constituents described in the present embodiment are not necessarily essential elements.

Figure 1:
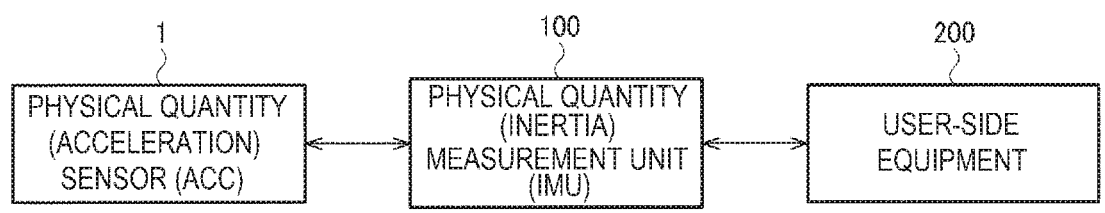
FIG. 1 is a block diagram showing a relationship between a physical quantity sensor according to the present embodiment, an inertial measurement unit, and user-side equipment.

1. Physical Quantity Sensor, Physical Quantity Measurement Unit, and User-Side External Equipment FIG. 1 shows a relationship between a physical quantity sensor such as an acceleration sensor (ACC) 1, a physical quantity measurement unit such as an inertial measurement unit (IMU) 100, and a user-side external equipment 200. The physical quantity sensor 1 is coupled to the physical quantity measurement unit 100, and the physical quantity measurement unit 100 is coupled to the user-side external equipment 200. The acceleration sensor (ACC) 1 and the inertial measurement unit (IMU) 100 can be installed in the user-side external equipment 200. In the present embodiment, while the physical quantity sensor 1 is collecting a first signal for detecting a physical quantity from a first element section, a second signal to be a monitor signal for monitoring whether or not the first element section is abnormal is collected from a second element section. Based on the second signal to be the monitor signal, the situation of the element sections can be determined by the physical quantity sensor 1 alone. This makes it possible to inform the user-side external equipment 200 with the timing for performing the self-diagnosis of the physical quantity sensor 1 from the physical quantity sensor 1 via the physical quantity measurement unit 100. Thus, it is possible for the physical quantity sensor 1 and the physical quantity measurement unit 100 to not only wait for the request for the self-diagnosis from the user-side external equipment 200, but also prompt the request for the self-diagnosis from the user-side external equipment 200 when it is determined that the self-diagnosis is necessary. Thus, it is possible to resolve the situation that the self-diagnosis is not performed in the element sections for a relatively long period of time, and thus, the abnormality determination of the element sections delays.

2. Physical Quantity Sensor 2.1. Element Sections

Figure 2:
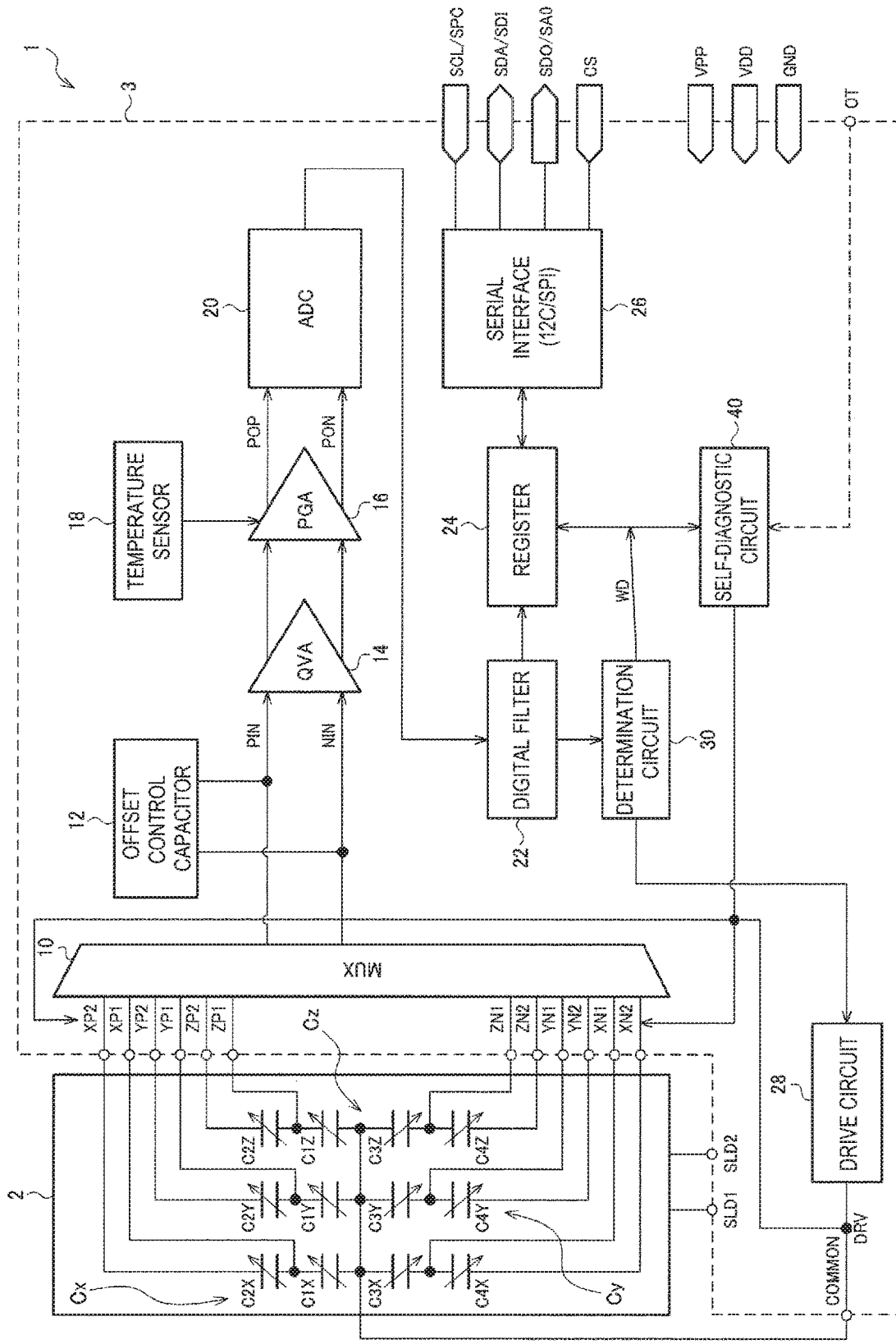
FIG. 2 is a block diagram of the physical quantity sensor according to the embodiment.

FIG. 2 is a diagram showing a functional configuration of the physical quantity sensor 1 according to the present embodiment. The physical quantity sensor 1 according to the present embodiment includes the element sections 2 and a physical quantity detection circuit 3. Firstly, the element sections 2 will be described. The element sections 2 detect a physical quantity such as the acceleration in three axes (an X axis, a Y axis, and a Z axis) crossing, for example perpendicular to, each other. As shown in FIG. 2, the element sections 2 include an X-axis detection element $C_x$ ($C_{1X}$ through $C_{4X}$) for outputting a detection signal corresponding to the acceleration applied in a direction along the X axis, a Y-axis detection element $C_y$ ($C_{1Y}$ through $C_{4Y}$) for outputting a detection signal corresponding to the acceleration applied in a direction along the Y axis, and a Z-axis detection element $C_z$ ($C_{1Z}$ through $C_{4Z}$) for outputting a detection signal corresponding to the acceleration applied in a direction along the Z axis. The detection axes of the physical quantity detection elements $C_x$, $C_y$, and $C_z$ correspond to the X axis, the Y axis, and the Z axis, respectively.

In the present embodiment, the physical quantity detection elements $C_x$, $C_y$, and $C_z$ each include a stationary part provided with a first stationary electrode and a second stationary electrode, and a movable electrode (a movable part). The first stationary electrode and the movable electrode are opposed to each other, and a first capacitance forming section is constituted by the first stationary electrode and the movable electrode. Similarly, the second stationary electrode and the movable electrode are opposed to each other, and a second capacitance forming section is constituted by the second stationary electrode and the movable electrode. The X-axis detection element $C_x$ includes the first capacitance forming sections $C_{1X}$ through $C_{2X}$ and the second capacitance forming sections $C_{3X}$ through $C_{4X}$. The Y-axis detection element $C_y$ includes the first capacitance forming sections $C_{1Y}$ through $C_{2Y}$ and the second capacitance forming sections $C_{3Y}$ through $C_{4Y}$. The Z-axis detection element $C_z$ includes the first capacitance forming sections $C_{1Z}$ through $C_{2Z}$ and the second capacitance forming sections $C_{3Z}$ through $C_{4Z}$.

When the acceleration "a" in the detection axis direction is applied to each of the physical quantity detection elements $C_x$, $C_y$, and $C_z$, the force F which fulfills F=m×a acts on the movable part having the mass m. Due to the force F, the movable part is displaced relatively to the stationary part. In this case, in accordance with the direction of the acceleration "a," the capacitance value of the first capacitance forming section decreases, and at the same time, the capacitance value of the second capacitance forming section increases, or the capacitance value of the first capacitance forming section increases, and at the same time, the capacitance value of the second capacitance forming section decreases. Therefore, when the acceleration "a" acts on the physical quantity detection elements $C_x$, $C_y$, and $C_z$ in the state in which the charge is supplied to a common end of the first capacitance forming section and the second capacitance forming section, the charges (signals) respectively output from one end of the first capacitance forming section and one end of the second capacitance forming section form a differential signal pair equal in absolute value to each other and opposite in sign to each other. The fact that the absolute values are equal to each other includes the state in which the absolute values are substantially equal to each other in addition to the fact that the absolute values are equal to each other. In other words, this means that there is included when one of the charges (signals) is shifted a small amount, for example, within about 10%, from the other of the charges (signals) in consideration of an error which can occur in manufacturing. The physical quantity detection circuit 3 generates three-axis physical quantity signals (an X-axis acceleration signal, a Y-axis acceleration signal, and a Z-axis acceleration) using the differential pairs respectively output from the physical quantity detection elements $C_x$, $C_y$, and $C_z$ as the detection signals.

Such physical quantity detection elements $C_x$, $C_y$, and $C_z$ are each a differential capacitive sensor, and are each formed of MEMS (Micro Electro-Mechanical Systems) using a semiconductor material such as Si (silicon), and the semiconductor processing technology.

2.2. Capacitances of Element Sections

In the present embodiment, the physical quantity sensor 1 not only waits for the request for the self-diagnosis from the user-side external equipment 200, but the element sections 2 are also provided with a structure of collecting the monitor signals to be the determination object for prompting the user for the self-diagnosis of the physical quantity sensor 1. For this reason, the first capacitance forming section includes a first capacitance and a second capacitance, and the second capacitance forming section also includes a first capacitance and a second capacitance. Specifically, the first capacitance forming section of the X-axis detection element $C_x$ includes the first capacitance $C_{1X}$ and the second capacitance $C_{2X}$. The second capacitance forming section of the X-axis detection element $C_x$ includes the first capacitance $C_{3X}$ and the second capacitance $C_{4X}$. Similarly, the first capacitance forming section of the Y-axis detection element $C_y$ includes the first capacitance $C_{1Y}$ and the second capacitance $C_{2Y}$. The second capacitance forming section of the Y-axis detection element $C_y$ includes the first capacitance $C_{3Y}$ and the second capacitance $C_{4Y}$. Similarly, the first capacitance forming section of the Z-axis detection element $C_z$ includes the first capacitance $C_{1Z}$ and the second capacitance $C_{2Z}$. The second capacitance forming section of the Z-axis detection element $C_z$ includes the first capacitance $C_{3Z}$ and the second capacitance $C_{4Z}$. Therefore, the physical quantity detection circuit 3 coupled to the element sections 2 has twelve terminals XP1, XP2, XN1, XN2, YP1, YP2, YN1, YN2, ZP1, ZP2, ZN1, and ZN2 coupled to the first capacitances and the second capacitances in the X, Y, and Z axes.

Figure 3:
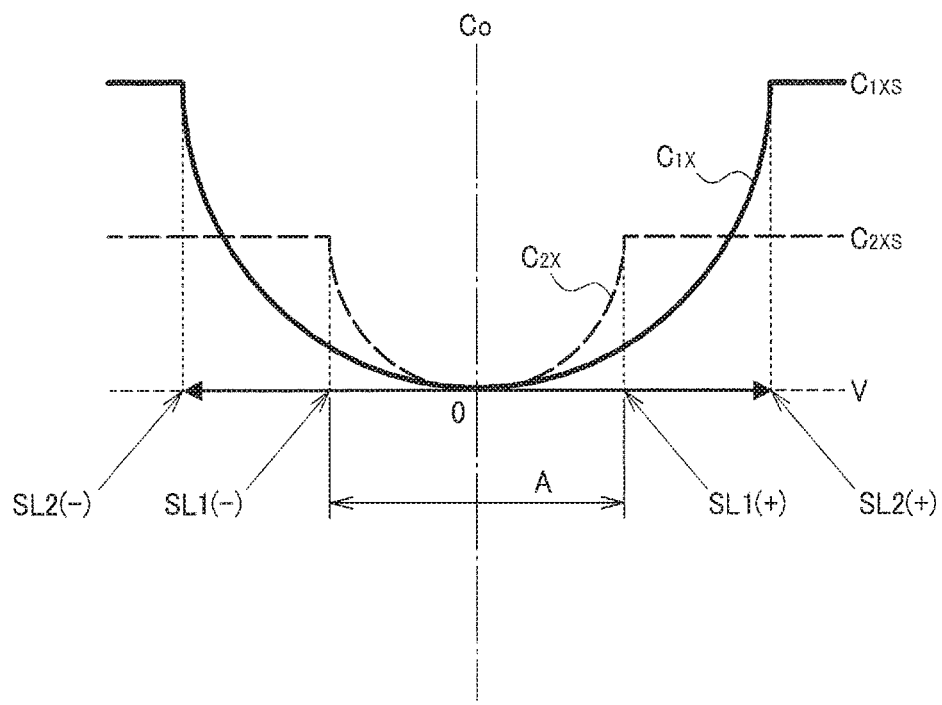
FIG. 3 is a characteristics chart showing a relationship between a first capacitance and a second capacitance.
Figure 4:
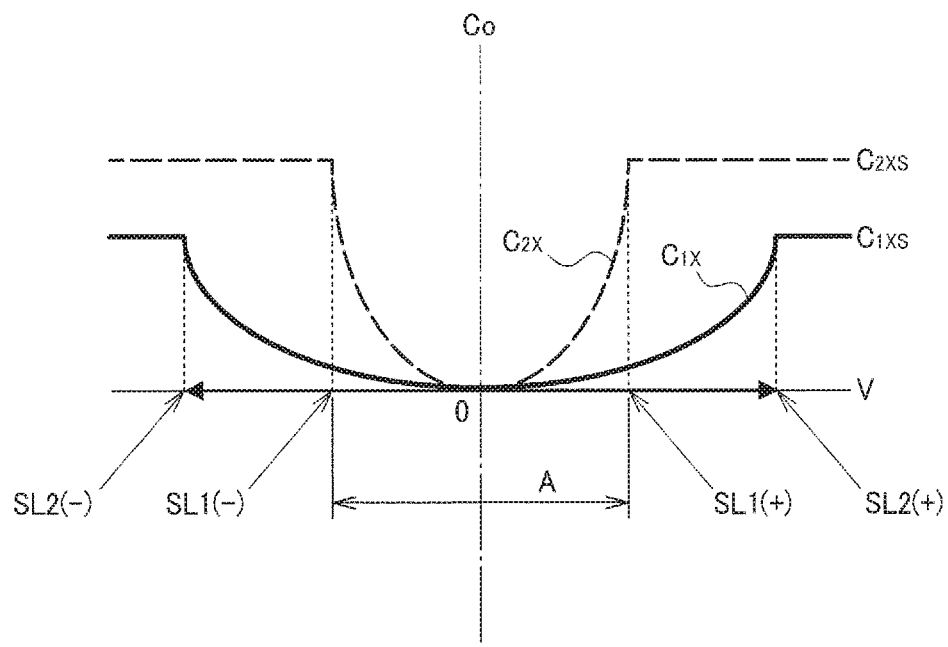
FIG. 4 is another characteristics chart showing the relationship between the first capacitance and the second capacitance.

The relationship between the first capacitance $C_{1X}$ and the second capacitance $C_{2X}$ is shown in FIG. 3 or FIG. 4. It should be noted that it is assumed that the relationships between other first capacitances and other second capacitances are also as shown in FIG. 3 or FIG. 4, and the description thereof will be omitted. In FIG. 3 and FIG. 4, the vertical axis represents the capacitance value Co, and the horizontal axis represents the voltage V to be applied to the capacitance. In the physical quantity sensor 1, the capacitance value changes due to the acceleration, and the capacitance value is converted into a voltage. Therefore, the voltage corresponding to the capacitance value in the vertical axis shown in FIG. 3 and FIG. 4 corresponds to the acceleration.

In either of FIG. 3 and FIG. 4, the first capacitance $C_{1X}$ has a first saturation capacitance value $C_{1XS}$, the second capacitance $C_{2X}$ has a second saturation capacitance value $C_{2XS}$, and the absolute value of a second physical quantity (a physical quantity corresponding to a second saturation voltage SL2(+) or SL2(−)) corresponding to the second saturation capacitance value $C_{2XS}$ is smaller than the absolute value of a first physical quantity (a physical quantity corresponding to a first saturation voltage SL1(+) or SL1(−)) corresponding to the first saturation capacitance value $C_{1XS}$. In other words, it is sufficient for the second capacitor $C_{2X}$ to inevitably be saturated prior to the saturation of the first capacitance $C_{1X}$ when the same acceleration acts thereon. Based on this relationship, it is arranged that the first capacitance $C_{1X}$ is used for the detection of physical quantity to prompt the user for the self-diagnosis of the first capacitance $C_{1X}$ at the timing when the second capacitance $C_{2X}$ is saturated in advance. It is possible to set the absolute value of the second physical quantity to, for example, 50 through 90% of the absolute value of the first physical quantity in consideration of the usage in the ordinary use range (a use range in which the self-diagnosis is unnecessary) in which the use frequency is high, and the absolute value of the physical quantity is smaller than the absolute value of the largest detectable first physical quantity in specification. In other words, the ordinary use range in which the self-diagnosis is unnecessary on the grounds of being a relatively safe use range is assumed to be a range in which the absolute value is smaller than 50 through 90% of the absolute value of the largest detectable first physical quantity. It is conceivable that in the range in which the absolute value is 50 through 90% of the absolute value of the largest detectable first physical quantity in specification, more preferably, the range in which the absolute value is 60 through 90% of the absolute value of the first physical quantity, the use is relatively low in frequency, and is momentary if any. When it is determined that the magnitude of the physical quantity acting thereon is out of the ordinary use range such as reaching the second physical quantity, the self-diagnosis is requested to the user side. Thus, it is possible to reduce the negative effect that the chances for vainly performing the self-diagnosis are excessively frequently set, and furthermore, it is possible to request the user side for the self-diagnosis when the necessity is high.

Figure 5:
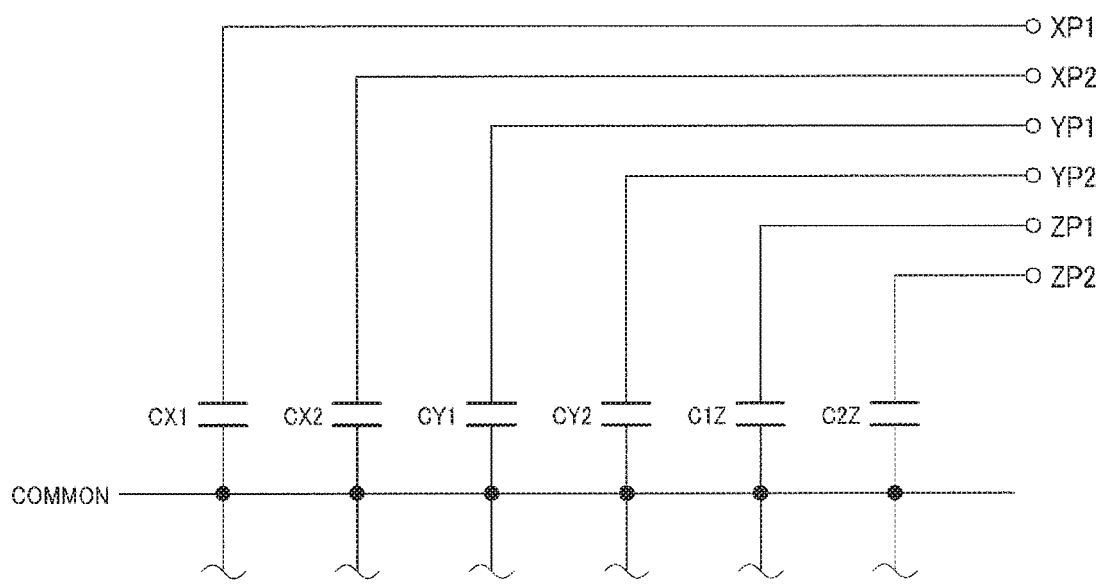
FIG. 5 is a diagram showing the first capacitance and the second capacitance directly coupled between a common line and terminals.

As long as this condition is fulfilled, it is possible to fulfill (first saturation capacitance value $C_{1XS}$)>(second saturation capacitance value $C_{2XS}$) as shown in FIG. 3, for it is possible to fulfill (first saturation capacitance value $C_{1XS}$)<(second saturation capacitance value $C_{2XS}$) as shown in FIG. 4. Here, unlike FIG. 2, it is possible to adopt a configuration in which the first capacitance $C_{1X}$ and the second capacitance $C_{2X}$ are not serially coupled, but the first capacitance $C_{1X}$ is coupled between a common line and the terminal XP1, and the second capacitance $C_{2X}$ is coupled between the common line and the terminal XP2 as shown in FIG. 5. Denoting the capacitance value by C, the both-end voltage of the capacitance by V, and the charge by Q, Q=CV becomes true. Therefore, the charge proportional to the capacitance value of the first capacitance $C_{1X}$ as a single capacitance is output to the terminal XP1, and the charge proportional to the capacitance value of the second capacitance $C_{2X}$ as a single capacitance is output to the terminal XP2. Further, in either of FIG. 3 and FIG. 4, the broad range of the first saturation voltage SL1(+) through SL1(−) can be used as the physical quantity detection range based on the first signal from the first signal line coupled to the terminal XP1. On the other hand, in either of FIG. 3 and FIG. 4, the range A of the second saturation voltage SL2(+) through SL2(−) can be used for the determination that the self-diagnosis of the first capacitance $C_{1X}$ is unnecessary based on the second signal from the second signal line coupled to the terminal XP2. In other words, when the absolute value of the voltage corresponding to the second signal exceeds the range A, it is possible to provide the user side with the prompt that the self-diagnosis of the first capacitance $C_{1X}$ is necessary. In this case, the threshold voltage Vref to be compared with the second signal is the absolute value of the second saturation voltage SL2(−) or SL2(+). In other words, the threshold voltage Vref is a voltage level of the second signal to be output to the terminal XP2 when the second physical quantity with which the second capacitance $C_{2X}$ reaches the second saturation capacitance value $C_{2XS}$ acts thereon.

Unlike FIG. 5, it is also possible for the first capacitance $C_{1X}$ and the second capacitance $C_{2X}$ to, for example, serially be coupled to each other as shown in FIG. 2. In this case, the charge proportional to the first capacitance $C_{1X}$ as the single capacitance is output to the terminal XP1 shown in FIG. 2 similarly to FIG. 5 on the one hand, and the charge proportional to the combined capacitance as described below is output to the terminal XP2 shown in FIG. 2 on the other hand.

Terminal XP1: $C_{1X}$
Terminal XP2: $(C_{1X} \times C_{2X})/(C_{1X}+C_{2X})$

Since $(C_{1X} \times C_{2X})/(C_{1X}+C_{2X}) < C_{1X}$ is true, in the example shown in FIG. 2, by using the terminal XP1 coupled to the first capacitance $C_{1X}$ as the physical quantity detection terminal, it is possible to use the voltage range of the first saturation voltage SL1(+) through SL1(−) shown in FIG. 3 as the physical quantity detection range. On the other hand, in the example shown in FIG. 2, the terminal XP2 coupled to the second capacitance $C_{2X}$ is used for the determination of the necessity of the self-diagnosis of the first capacitance $C_{1X}$. In other words, the second signal can also be a signal proportional to the combined capacitance of the first capacitance $C_{1X}$ and the second capacitance $C_{2X}$. In this case, for the range in which the self-diagnosis of the first capacitance $C_{1X}$ is unnecessary, the second saturation voltage SL2(+) or SL2(−) obtained only by the second capacitance $C_{2X}$ shown in FIG. 3 cannot be used as the threshold voltage. Therefore, in this case, the second signal to be output to the terminal XP2 when the second physical quantity with which the second capacitance $C_{2X}$ reaches the second saturation capacitance value $C_{2XS}$ acts thereon, namely the charge (voltage) proportional to the combined capacitance $(C_{1X} \times C_{2X})/(C_{1X}+C_{2X})$, is obtained in advance, and then this voltage level is used as the threshold voltage Vref. This saturates the capacitance $C_{2X}$ when the second physical quantity acts thereon, but the voltage of the second signal output to the terminal XP2 is not saturated. Therefore, it is sufficient to compare the voltage level of the second signal from the second signal line coupled to the terminal XP2 with the threshold voltage Vref to determine that the self-diagnosis is necessary when the voltage level reaches the threshold voltage Vref. In other words, it is sufficient for both of the structures of the element sections shown in FIG. 2 and FIG. 5 to determine whether or not the level of the second signal reaches the threshold voltage Vref which is obtained in advance when the second physical quantity acts. The threshold voltage Vref can also be set as a calculational design value.

From other terminals, there are also output the charges proportional to the capacitances as described below.

Terminal XN1: $C_{3X}$
Terminal XN2: $(C_{3X} \times C_{4X})/(C_{3X}+C_{4X})$
Terminal YP1: $C_{1Y}$
Terminal YP2: $(C_{1Y} \times C_{2Y})/(C_{1Y}+C_{2Y})$
Terminal YN1: $C_{3Y}$
Terminal YN2: $(C_{3Y} \times C_{4Y})/(C_{3Y}+C_{4Y})$
Terminal ZP1: $C_{1Z}$
Terminal ZP2: $(C_{1Z} \times C_{2Z})/(C_{1Z}+C_{2Z})$
Terminal ZN1: $C_{3Z}$
Terminal ZN2: $(C_{3Z} \times C_{4Z})/(C_{3Z}+C_{4Z})$ Therefore, it becomes possible to detect the acceleration in the X axis using the differential signal from the terminals XP1, XN1, it becomes possible to detect the acceleration in the Y axis using the differential signal from the terminals YP1, YN1, and it becomes possible to detect the acceleration in the Z axis using the differential signal from the terminals ZP1, ZN1. Further, it is possible to use the differential signal from the terminals XP2, XN2 as a judgment signal in the X axis, the differential signal from the terminals YP2, YN2 as a judgment signal in the Y axis, and the differential signal from the terminals ZP2, ZN2 as a judgment signal in the Z axis.

It should be noted that the element sections 2 are provided with ground patterns not shown for shielding, and each of the ground patterns is supplied with a shield voltage (e.g., 0 V) via shield terminals SLD1, SLD2 of the physical quantity detection circuit 3.

2.3. Physical Quantity Detection Circuit

As shown in FIG. 2, the physical quantity detection circuit 3 can be provided with a multiplexer (MUX) 10, an offset control capacitor 12, a Q/V amplifier (QVA) 14, a programmable-gain amplifier (PGA) 16, a temperature sensor 18, an A/D conversion circuit (ADC) 20, a digital filter 22, a register 24, a serial interface 26, and a drive circuit 28.

Figure 6:
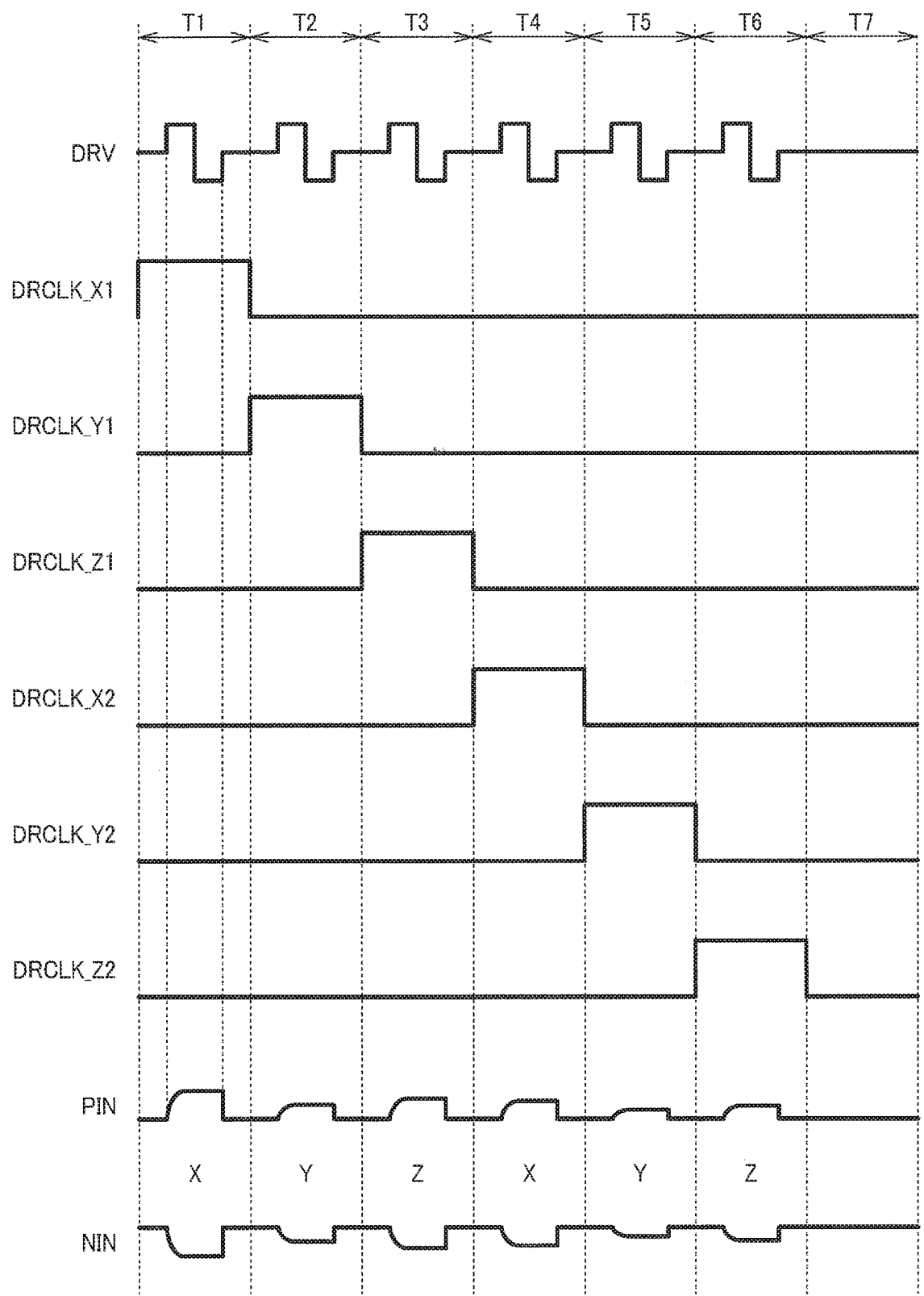
FIG. 6 is a timing chart for explaining drive of an element section.

The multiplexer 10 selects any one of the differential signal pairs input from two of the twelve terminals XP1, XN1, . . . , ZP2, and ZN2 based on the clock signals DRVCLK_X1, DRVCLK_Y1, DRVCLK_Z1, DRVCLK_X2, DRVCLK_Y2, and DRVCLK_Z2 which are shown in FIG. 6, and are activated (becomes in a high level in the present embodiment) exclusively from each other, and then outputs the differential signal pair PIN, NIN.

Specifically, as shown in FIG. 6, in a period T1 in which the clock signal DRVCLK_X1 is in the high level (the power supply voltage VDD), the multiplexer 10 selects the differential signal pair input from the terminals XP1, XN1 to output the differential signal pair thus selected as the differential signal pair PIN, NIN. Further, in the period T2 in which the clock signal DRVCLK_Y1 is in the high level, the multiplexer 10 selects the differential signal pair input from the terminals YP1, YN1 to output the differential signal pair thus selected as the differential signal pair PIN, NIN. Further, in the period T3 in which the clock signal DRVCLK_Z1 is in the high level, the multiplexer 10 selects the differential signal pair input from the terminals ZP1, ZN1 to output the differential signal pair thus selected as the differential signal pair PIN, NIN. Further, in the period T4 in which the clock signal DRVCLK_X2 is in the high level, the multiplexer 10 selects the differential signal pair input from the terminals XP2, XN2 to output the differential signal pair thus selected as the differential signal pair PIN, NIN. Further, in the period T5 in which the clock signal DRVCLK_Y2 is in the high level, the multiplexer 10 selects the differential signal pair input from the terminals YP2, YN2 to output the differential signal pair thus selected as the differential signal pair PIN, NIN. Further, in the period T6 in which the clock signal DRVCLK_Z2 is in the high level, the multiplexer 10 selects the differential signal pair input from the terminals ZP2, ZN2 to output the differential signal pair thus selected as the differential signal pair PIN, NIN. Further, in the period T7 in which all of the clock signals DRVCLK_X1 through DRVCLK_Z2 are in the low level (the power supply voltage VSS (e.g., 0 V)), the multiplexer 10 outputs the differential signal pair PIN, NIN both at a level of zero.

As shown in FIG. 6, in the drive circuit 28, the voltage of the drive signal DRV periodically changes in the order of the reference voltage VCOM (e.g., VDD/2)→VDD→VSS (=0 V)→VCOM in each of the periods T1 through T6, and the voltage of the drive signal DRV is VCOM in the period T7.

In the period T1 through T3, the first capacitances $C_{1X}$, $C_{3X}$, $C_{1Y}$, $C_{3Y}$, $C_{1Z}$, and $C_{3Z}$ are driven by the drive signal DRV from the drive circuit 28. Firstly, in the period T1, the differential signal pair corresponding to the X-axis acceleration is output from the first capacitances $C_{1X}$, $C_{3X}$, and is then input to the terminals XP1, XN1, and is then output by the multiplexer 10 as the differential signal pair PIN, NIN. Then, in the period T2, the differential signal pair corresponding to the Y-axis acceleration is output from the first capacitances $C_{1Y}$, $C_{3Y}$, and is then input to the terminals YP1, YN1, and is then output by the multiplexer 10 as the differential signal pair PIN, NIN. Then, in the period T3, the differential signal pair corresponding to the Z-axis acceleration is output from the first capacitances $C_{1Z}$, $C_{3Z}$, and is then input to the terminals ZP1, ZN1, and is then output by the multiplexer 10 as the differential signal pair PIN, NIN.

In the period T4 through T6, the second capacitances $C_{2X}$, $C_{4X}$, $C_{2Y}$, $C_{4Y}$, $C_{2Z}$, and $C_{4Z}$ are driven by the drive signal DRV from the drive circuit 28. Firstly, in the period T4, the differential signal pair corresponding to the X-axis acceleration is output from the second capacitances $C_{2X}$, $C_{4X}$, and is then input to the terminals XP2, XN2, and is then output by the multiplexer 10 as the differential signal pair PIN, NIN. Then, in the period T5, the differential signal pair corresponding to the Y-axis acceleration is output from the second capacitances $C_{2Y}$, $C_{4Y}$, and is then input to the terminals YP2, YN2, and is then output by the multiplexer 10 as the differential signal pair PIN, NIN. Then, in the period T6, the differential signal pair corresponding to the Z-axis acceleration is output from the second capacitances $C_{2Z}$, $C_{4Z}$, and is then input to the terminals ZP2, ZN2, and is then output by the multiplexer 10 as the differential signal pair PIN, NIN. Further, in the period T7, since all of the clock signals DRVCLK_X1 through DRVCLK_Z2 are in the low level, both of the differential signal pair PIN, NIN are set to zero. It should be noted that in order to set both of the differential signal pair PIN, NIN to zero, the offset control capacitor 12 is coupled to a differential signal pair output line of the multiplexer 10. The offset control capacitor 12 performs a zero point adjustment for each of the X, Y, and Z axes in each of the first capacitance and the second capacitance.

In FIG. 2, the Q/V amplifier 14 converts the differential signal pair PIN, NIN of the charge output from the multiplexer 10 into a differential signal pair of the voltage. The differential signal pair (a differential voltage signal) output from the Q/V amplifier 14 is input to the programmable-gain amplifier (PGA) 16, and the programmable-gain amplifier 16 outputs a differential signal pair POP, PON obtained by amplifying the differential signal pair. It is possible for the PGA 16 to correct the bias which drifts depending on the temperature based on the temperature detected by the temperature sensor 18. The A/D conversion circuit 20 samples the differential signal pair output by the PGA 16 based on the clock signal to convert the potential difference of the differential signal pair into a digital signal. The digital filter 22 performs a filtering process on the digital signal output from the A/D conversion circuit 20. Since the high-frequency noise generated by the A/D conversion process by the A/D conversion circuit 20 is superimposed on the digital signal output from the A/D conversion circuit 20, the digital filter 22 functions as a low-pass filter for reducing the high-frequency noise. The digital filter 22 can be made to function as a high-pass filter as needed.

The register 24 stores data necessary for the operation of the physical quantity detection circuit 3, data to be input/output via the serial interface 26, and so on. The serial interface 26 is a circuit for communicating with the inertial measurement unit 100 shown in FIG. 1. The inertial measurement unit 100 is capable of performing writing and reading of the data to and from the register 24 via the serial interface 26. In particular, signals corresponding to the X, Y, and Z axis accelerations based on the X, Y, and Z differential signal pairs output in the periods T1 through T3 from the first signal line coupled to the first capacitances $C_{1X}$, $C_{3X}$, $C_{1Y}$, $C_{3Y}$, $C_{1Z}$, and $C_{3Z}$ are output to the inertial measurement unit 100 via the serial interface 26. The serial interface 26 can be, for example, a three-terminal or four-terminal SPI (Serial Peripheral Interface) interface circuit, or can be a two-terminal I²C (Inter-Integrated Circuit) interface circuit, or can also be switchable between these interface circuits.

2.3.1. Determination Circuit

The physical quantity detection circuit 3 shown in FIG. 2 further includes a determination circuit 30. The second signals (comparison target signals) corresponding to the X, Y, and Z axis accelerations based on the X, Y, and Z differential signal pairs output in the periods T4 through T6 from the second signal line coupled to the second capacitances $C_{2X}$, $C_{4X}$, $C_{2Y}$, $C_{4Y}$, $C_{2Z}$, and $C_{4Z}$ are input to the determination circuit 30 via the digital filter 22, and are then compared with the threshold voltage Vref described above. As described using FIG. 3 and FIG. 4, when the level of the comparison target signal exceeds the threshold voltage Vref, a determination signal WD activated at that moment is output from the determination circuit 30, and is then stored in the register 24. The determination signal WD in the active state is transferred as a caution signal to the inertial measurement unit 100 via the serial interface 26, and is further transferred to the user-side external equipment 200. Further, when the level of the comparison target signal exceeds the threshold voltage Vref, the determination circuit 30 outputs an instruction of making the drive circuit 28 stop outputting the drive signal DRV to the drive circuit 28. Thus, sensing is stopped.

2.3.2. Self-Diagnostic Circuit

The physical quantity detection circuit 3 shown in FIG. 2 can further include a self-diagnostic circuit 40. The self-diagnostic circuit 40 performs a diagnosis on whether or not there is an abnormality in the first capacitances $C_{1X}$, $C_{3X}$, $C_{1Y}$, $C_{3Y}$, $C_{1Z}$, and $C_{3Z}$ in the element sections 2 based on the comparison result by the digital comparator at a timing when the self-diagnosis described later is necessary. The configuration and the operation of the self-diagnostic circuit 40 will be described with reference to FIG. 7 and FIG. 8.

Figure 7:
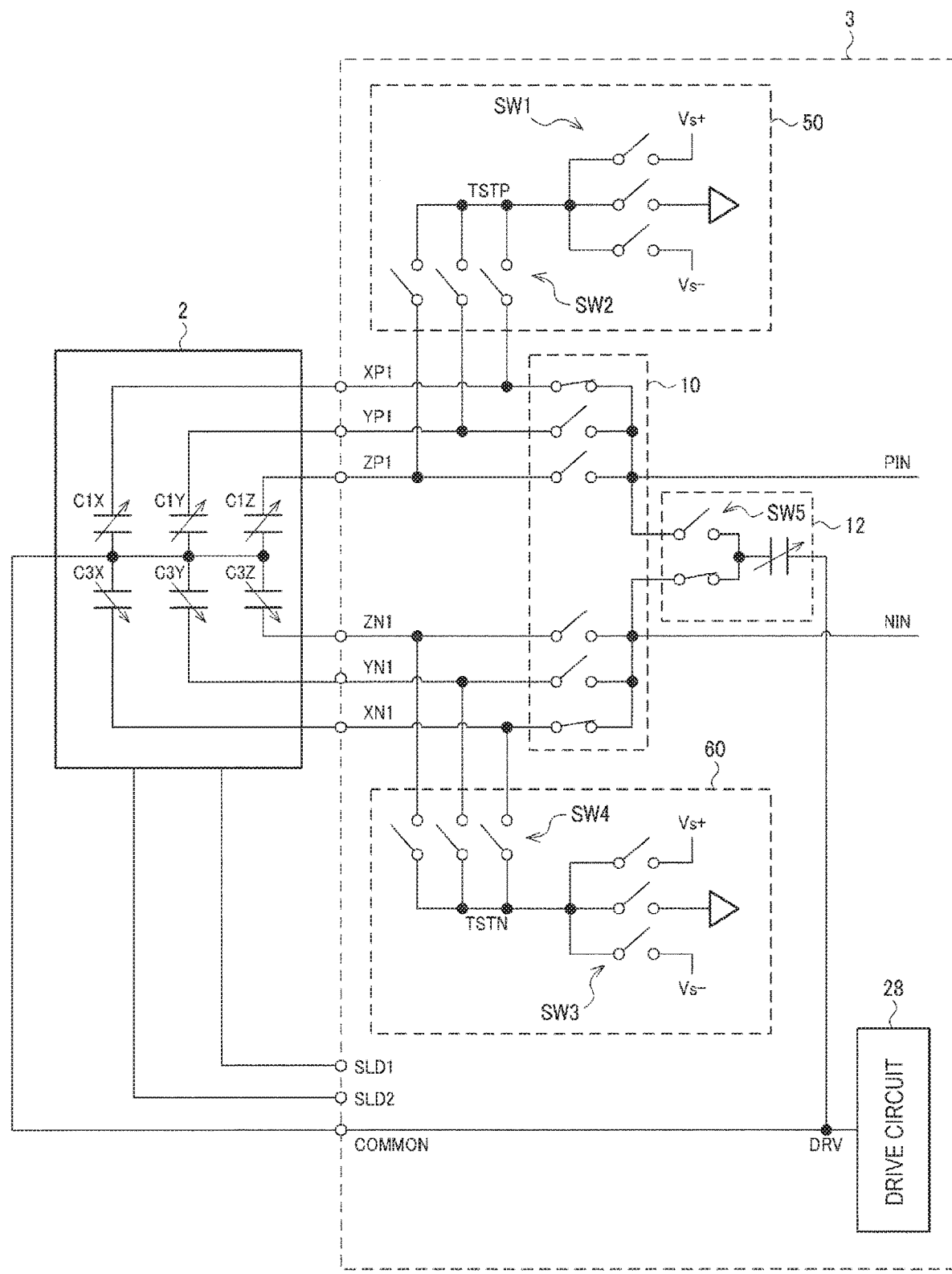
FIG. 7 is a circuit diagram showing a part of a self-diagnostic circuit shown in FIG. 2.

As shown in FIG. 7, the self-diagnostic circuit 40 includes a first test signal supply section 50 and a second test signal supply section 60 in order to drive the first capacitances $C_{1X}$, $C_{3X}$, $C_{1Y}$, $C_{3Y}$, $C_{1Z}$, and $C_{3Z}$ when performing the self-diagnosis. The first test signal supply section 50 supplies a first test signal TSTP to one end of each of the first capacitances $C_{1X}$, $C_{3X}$, $C_{1Y}$, $C_{3Y}$, $C_{1Z}$, and $C_{3Z}$ when performing the self-diagnosis. The second test signal supply section 60 supplies a second test signal TSTN to the other end of each of the first capacitances $C_{1X}$, $C_{3X}$, $C_{1Y}$, $C_{3Y}$, $C_{1Z}$, and $C_{3Z}$ when performing the self-diagnosis. It should be noted that in the element sections 2 shown in FIG. 7, the second capacitances $C_{2X}$, $C_{4X}$, $C_{2Y}$, $C_{4Y}$, $C_{2Z}$, and $C_{4Z}$ and the terminals XP2, XN2, YP2, YN2, ZP2, and ZN2 coupled thereto are omitted.

The configuration and the operation of the first test signal supply section 50 and the second test signal supply section 60 will be described with reference to a timing chart shown in FIG. 8. The self-diagnostic circuit 40 operates as described below taking it as a necessary condition that the determination circuit 30 has determined that the self-diagnosis of the first capacitances $C_{1X}$, $C_{1Y}$, and $C_{1Z}$ or the first capacitances $C_{3X}$, $C_{3Y}$, and $C_{3Z}$ is necessary (when the determination signal WD has been activated).

Figure 8:
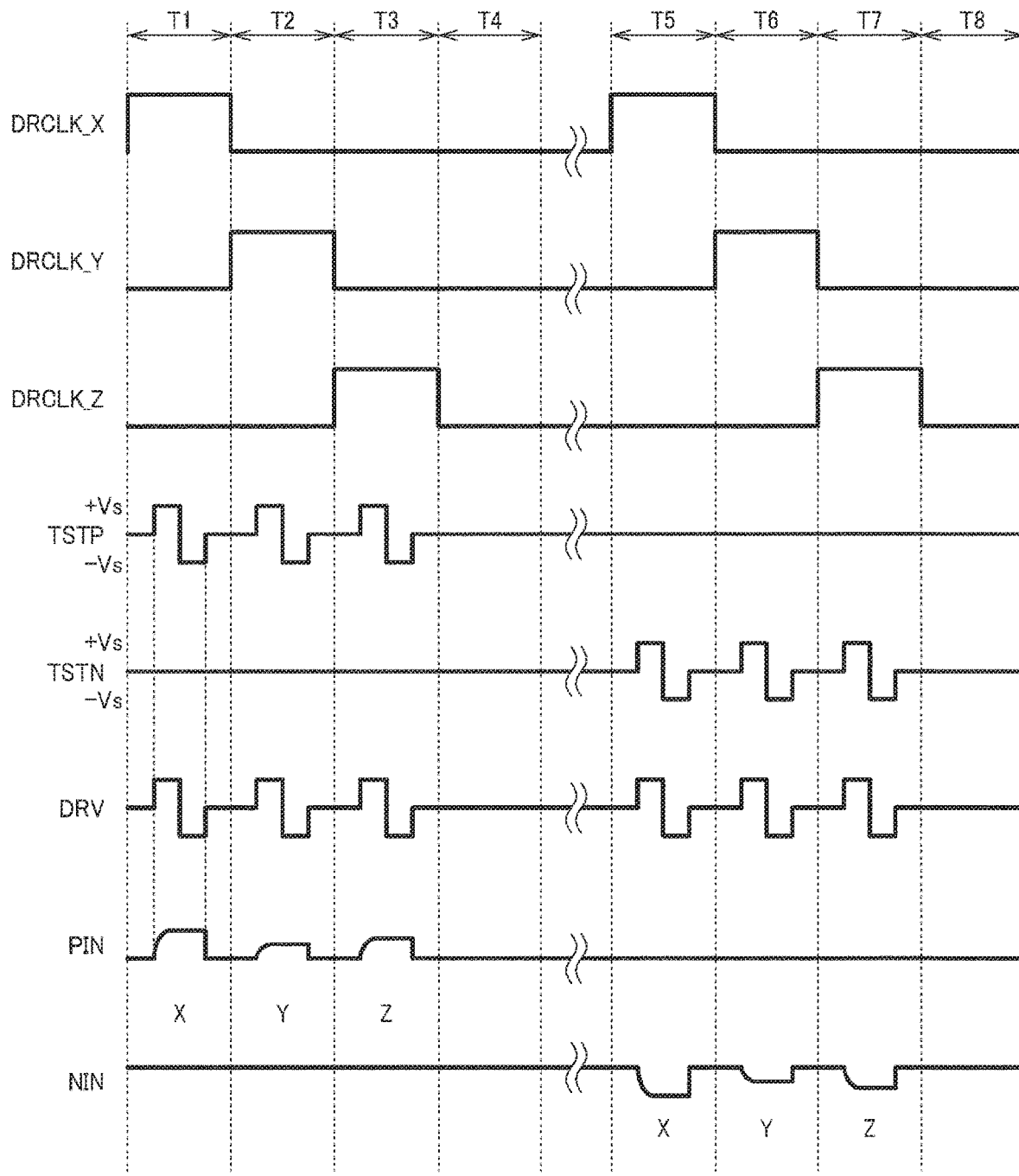
FIG. 8 is a timing chart of the self-diagnostic circuit.

FIG. 8 is the timing chart of the self-diagnostic circuit. FIG. 8 shows an example of waveforms of the clock signals DRVCLK_X, DRVCLK_Y, and DRVCLK_Z, the first test signal TSTP, the second test signal TSTN, the drive signal DRV, and the differential signal pair PIN, NIN when performing the self-diagnosis with a test mode signal not shown activated. The periods T1 through T4 shown in FIG. 8 represent the self-diagnostic operation of the first capacitances $C_{1X}$, $C_{1Y}$, and $C_{1Z}$, and the periods T5 through T8 shown in FIG. 8 represent the self-diagnostic operation of the first capacitances $C_{3X}$, $C_{3Y}$, and $C_{3Z}$.

Firstly, the operation in the periods T1 through T4 shown in FIG. 8 will be described. In this case, the first test signal supply section 50 shown in FIG. 7 selects the reference voltage VCOM (e.g., 0 V) as the voltage of the first test signal TSTP as shown in FIG. 8 using one of switches in a switch group SW1. Further, by the first test signal supply section 50 shown in FIG. 7 switching the switch group SW1, the first test signal TSTP changes in the order of the reference voltage VCOM→+Vs→−Vs→VCOM periodically in each of the periods T1, T2, and T3, and is kept at VCOM in the period T4 as shown in FIG. 8. It should be noted that the voltage levels of ±Vs will be described later using FIG. 10. As shown in FIG. 8, in the periods T1 through T4, the drive signal DRV becomes the same in waveform as the first test signal TSTP.

In the period T1 shown in FIG. 8, in accordance with the selection in the switch groups SW2, SW4 shown in FIG. 7, both ends of the first capacitance $C_{1X}$ shown in FIG. 7 are supplied with the drive signal DRV and the first test signal TSTP respectively. Thus, there is created substantially the same state as the state in which acceleration having predetermined magnitude and direction is applied to the first capacitance $C_{1X}$. Then, the first signal (X) selected by the multiplexer 10 is output from the signal line PIN via the terminal XP1 coupled to the first capacitance $C_{1X}$. The level of the first signal (X) is compared in the self-diagnostic circuit 40 with the threshold voltage, and thus, the self-diagnosis on whether or not the first capacitance $C_{1X}$ is abnormal is performed.

Similarly, in the period T2 shown in FIG. 8, the voltages are applied to both ends of the first capacitance $C_{1Y}$ shown in FIG. 7, and thus, the first signal (Y) selected by the multiplexer 10 is output from the signal line PIN via the terminal YP1 coupled to the first capacitance $C_{1Y}$. The level of the first signal (Y) is compared in the self-diagnostic circuit 40 with the threshold voltage, and thus, the self-diagnosis on whether or not the first capacitance $C_{1Y}$ is abnormal is performed. Similarly, in the period T3 shown in FIG. 8, the voltages are applied to both ends of the first capacitance $C_{1Z}$ shown in FIG. 7, and thus, the first signal (Z) selected by the multiplexer 10 is output from the signal line PIN via the terminal ZP1 coupled to the first capacitance $C_{1Z}$. The level of the first signal (Z) is compared in the self-diagnostic circuit 40 with the threshold voltage, and thus, the self-diagnosis on whether or not the first capacitance $C_{1Z}$ is abnormal is performed. It is also possible to perform the self-diagnosis a plurality of times for each of the first capacitances $C_{1X}$, $C_{1Y}$, and $C_{1Z}$ by repeatedly performing the periods T1 through T4 a plurality of times.

Then, the operation in the periods T5 through T8 shown in FIG. 8 will be described. In this case, by the second test signal supply section 60 shown in FIG. 7 switching a switch group SW3, the second test signal TSTN changes in the order of the reference voltage VCOM→+Vs→−Vs→V-COM periodically in each of the periods T5, T6, and T7, and is kept at VCOM in the period T8 as shown in FIG. 8. Further, the second test signal supply section 60 shown in FIG. 7 selects the reference voltage VCOM as the second test signal TSTN as shown in FIG. 8 using one of switches in the switch group SW3. As shown in FIG. 8, in the periods T5 through T8, the drive signal DRV becomes the same in waveform as the second test signal TSTN. Thus, in the periods T5 through T8, it is possible to perform the self-diagnosis of the first capacitances $C_{3X}$, $C_{3Y}$, and $C_{3Z}$ in substantially the same manner as in the periods T1 through T4. It is also possible to perform the self-diagnosis a plurality of times for each of the first capacitances $C_{3X}$, $C_{3Y}$, and $C_{3Z}$ by repeatedly performing the periods T5 through T8 a plurality of times.

2.3.3. Overall Operation

Figure 9:
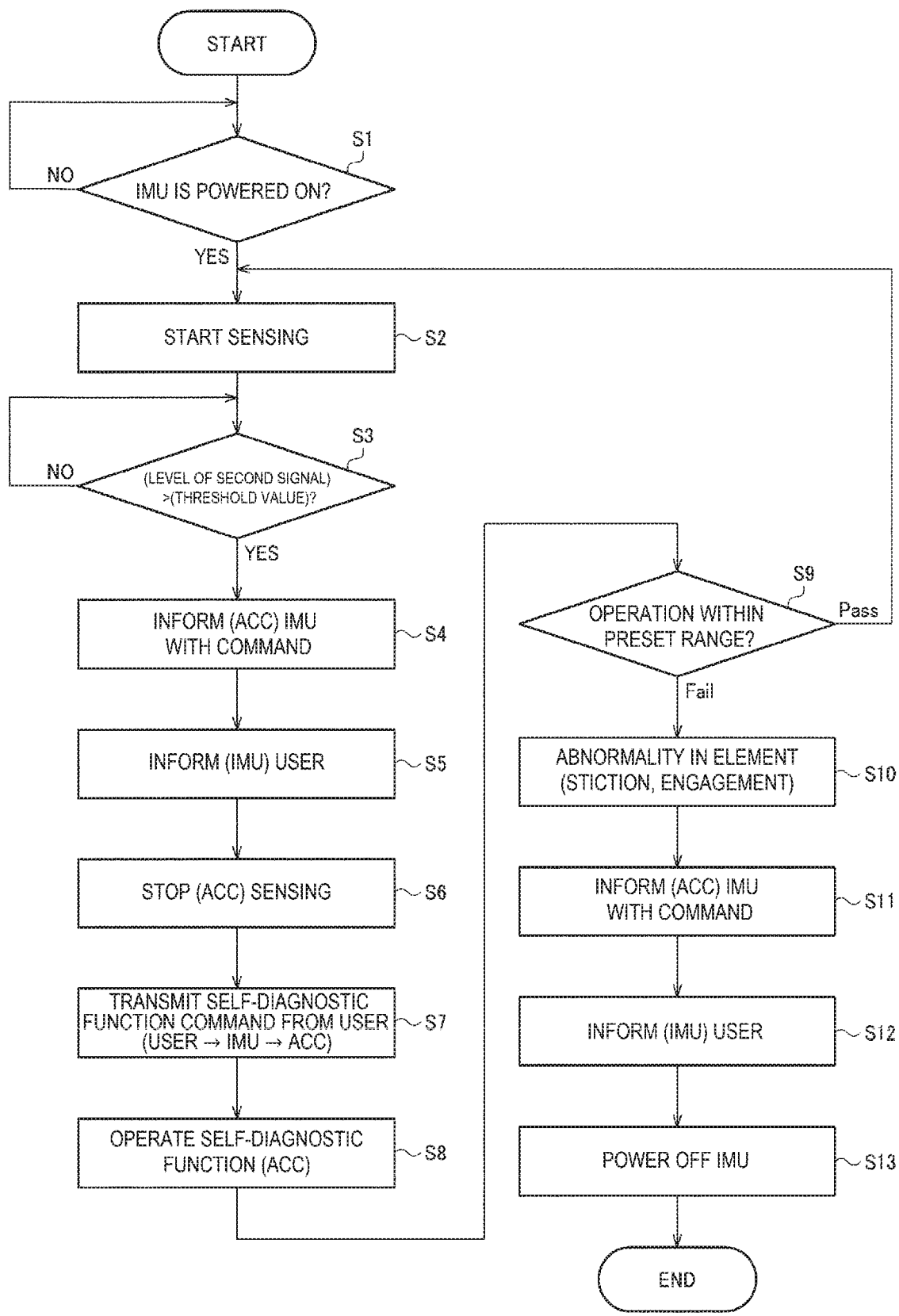
FIG. 9 is a flowchart showing operations of the physical quantity sensor according to the embodiment and the inertial measurement unit.

Then, the overall operation of the physical quantity sensor (ACC) 1 and the inertial measurement unit (IMU) 100 are described with reference to FIG. 9 and FIG. 10. In FIG. 9, firstly, when the inertial measurement unit (IMU) 100 is powered on (step 1), sensing shown in FIG. 6 is started (step 2) in the physical quantity sensor (ACC) 1. In the sensing, the first capacitances $C_{1X}$, $C_{3X}$, $C_{1Y}$, $C_{3Y}$, $C_{1Z}$, and $C_{3Z}$ are driven in the periods T1 through T3 shown in FIG. 6, and thus, the acceleration signals (the first signals) in the X, Y, and Z axes are collected. The acceleration signals (the first signals) in the X, Y, and Z axes are transferred to the inertial measurement unit (IMU) 100 via the register 24 and the serial interface 26. The acceleration signals (the first signals) in the X, Y, and Z axes are transferred from the inertial measurement unit (IMU) 100 to the user-side external equipment 200 as needed.

On the other hand, in the periods T4 through T6 shown in FIG. 6, the second capacitances $C_{2X}$, $C_{4X}$, $C_{2Y}$, $C_{4Y}$, $C_{2Z}$, and $C_{4Z}$ are driven, and thus, determination object signals (the second signals) in the X, Y, and Z axes are collected. The levels of the determination object signals (the second signals) in the X, Y, and Z axes are compared (step 3) with the threshold voltage Vref in the determination circuit 30. When the determination in the step 3 is NO, the sensing operation shown in FIG. 6 is repeatedly performed continuously.

Then, when the determination in the step 3 becomes YES will be described with reference also to FIG. 10. In FIG. 10, any one of the determination object signals (the second signals) in the X, Y, and Z axes reaches the threshold value 1(+) at the time point t1. It should be noted that the threshold value 1(+) is the threshold voltage +Vref set in the determination circuit 30, and is different between when being compared with the second signal proportional to a single capacitance shown in FIG. 2 and when being compared with the second signal proportional to a combined capacitance shown in FIG. 5 as described above. The same applies to the threshold value 1(−) shown in FIG. 10.

Figure 10:
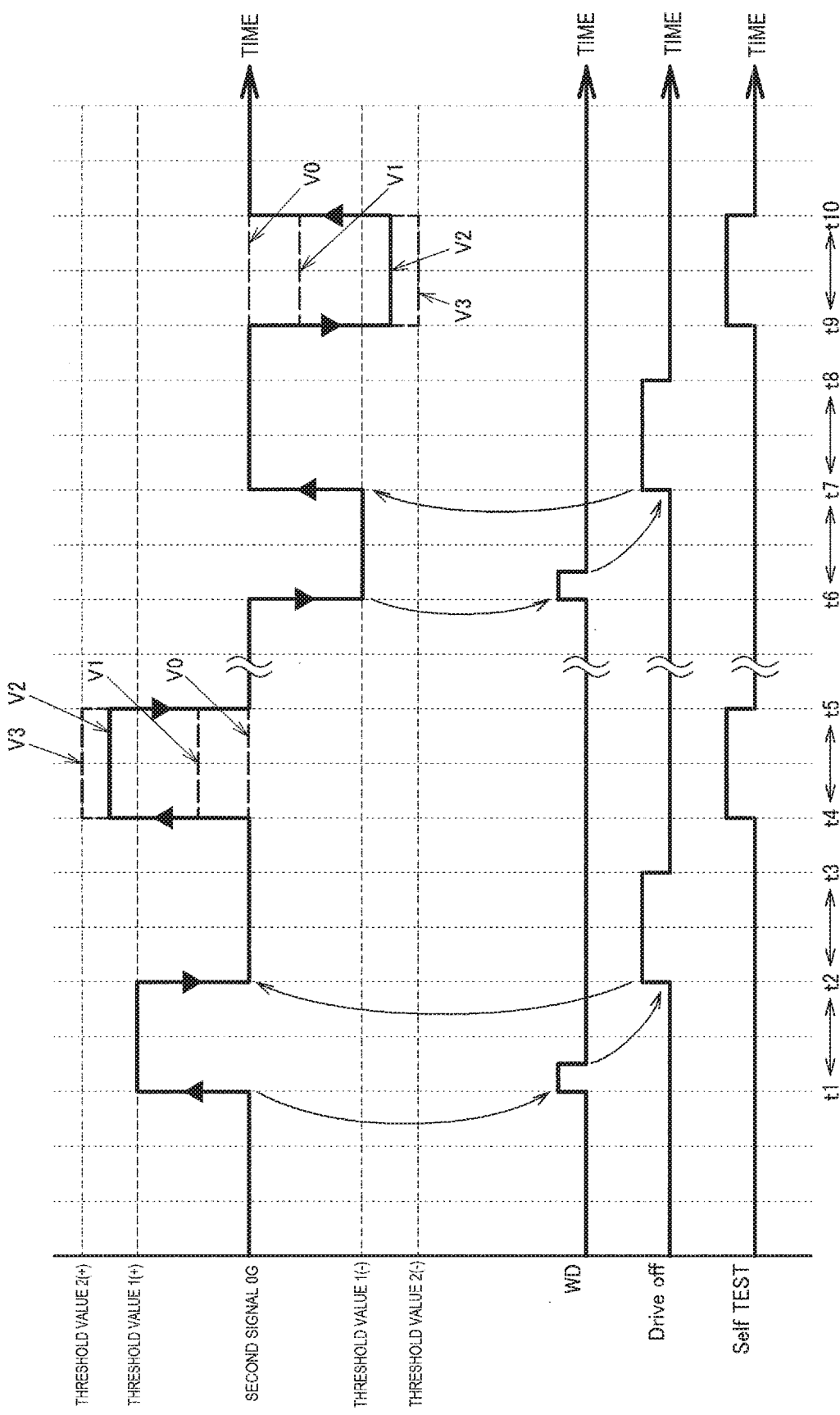
FIG. 10 is a timing chart for a determination operation and a self-diagnostic operation.

When the determination in the step 3 becomes YES at the time point t1 shown in FIG. 10, the determination signal WD activated shown in FIG. 10 is output from the determination circuit 30, and is then transferred (step 4) from the physical quantity sensor (ACC) 1 to the inertial measurement unit (IMU) 100 via the register 24 and the serial interface 26. Further, the determination signal WD activated is transferred (step 5) from the inertial measurement unit (IMU) 100 to the user-side external equipment 200. Thus, it is possible for the physical quantity sensor (ACC) 1 to prompt the user-side external equipment 200 for the request from the user-side external equipment 200 for making the physical quantity sensor 1 perform the self-diagnosis. Further, after outputting the determination signal WD activated, the determination circuit 30 stops the drive by the drive circuit 28 at the time point t2 as shown in FIG. 10 to stop (step 6) the sensing to prepare for the commencement of the self-diagnosis.

Subsequently, the self-diagnostic function command is transmitted (step 7) from the user-side external equipment 200 to the serial interface 26 of the physical quantity sensor (ACC) 1 via the inertial measurement unit (IMU) 100. Unlike the above, it is also possible to supply a trigger signal for starting the self-diagnosis to an external terminal OT of the physical quantity sensor 1 shown in FIG. 2 from the user-side external equipment 200 via the inertial measurement unit (IMU) 100. It is also possible to cancel the stoppage of the drive by the drive circuit 28 at the time point t3 as shown in FIG. 10 using the self-diagnostic function command or the trigger signal. It should be noted that in the embodiment shown in FIG. 7, since it is possible for the self-diagnostic circuit 40 to supply the drive signal DRV on behalf of the drive circuit 28, it is possible to continue the stoppage of the drive by the drive circuit 28 up to the time point t5 in FIG. 10.

At the time point t4 in FIG. 10, the self-diagnosis shown in FIG. 8 by the self-diagnostic circuit 40 of the physical quantity sensor (ACC) 1 is started (step 8). It should be noted that when the user-side external equipment 200 is, for example, a vehicle, and the physical quantity sensor (ACC) 1 detects the acceleration acting on the vehicle, the vehicle is stopped before transmitting the self-diagnostic function command. It should be noted that when the user-side external equipment 200 is, for example, a seismograph, there is no need to stop the drive of the user-side external equipment 200. Here, when the determination signal WD is activated (at the time point t1 in FIG. 10) for any one of the second capacitances $C_{2X}$, $C_{2Y}$, and $C_{2Z}$ compared by the determination circuit 30 with the threshold value 1(+), the self-diagnostic circuit 40 performs the self-diagnostic operation in the periods T1 through T4 shown in FIG. 8 between the time points t4 and t5. Thus, it is possible to perform the self-diagnosis on whether or not there is an abnormality in any one of the first capacitances $C_{1X}$, $C_{1Y}$, and $C_{1Z}$. On the other hand, when the determination signal WD is activated (at the time point t6 in FIG. 10) for any one of the second capacitances $C_{4X}$, $C_{4Y}$, and $C_{4Z}$ compared by the determination circuit 30 with the threshold value 1(−), the self-diagnostic circuit 40 performs the self-diagnostic operation in the periods T5 through T8 shown in FIG. 8 between the time points t9 and t10 after stopping the drive circuit 28 at the time point t7 in FIG. 10. Thus, it is possible to perform the self-diagnosis on whether or not there is an abnormality in any one of the first capacitances $C_{3X}$, $C_{3Y}$, and $C_{3Z}$.

The self-diagnostic circuit 40 performs (step 9) the diagnosis on whether or not the levels of the first signals proportional to the capacitance values of the first capacitances $C_{1X}$, $C_{1Y}$, and $C_{1Z}$ to which the voltages of ±Vs are applied are within a preset range between the threshold value 1(+) and a threshold value 2(+). The capacitances are normal when the levels of the first signals are a voltage V2 within the preset range. In other words, the voltage levels of ±Vs are set so that the levels of the first signals proportional to the capacitance values of the first capacitances $C_{1X}$, $C_{1Y}$, and $C_{1Z}$ which are normal become the voltage V2 between the threshold value 1(+) and the threshold value 2(+). When the level of the first signal proportional to the capacitance value of any one of the first capacitances $C_{1X}$, $C_{1Y}$, and $C_{1Z}$ to which the voltages of ±Vs are applied is any one of voltage levels V0, V1, and V3 outside a normal range as represented by a dotted line in FIG. 10 (Fail in the diagnosis in the step 9), it is determined (step 10) that an abnormality such as stiction or engagement between the stationary and movable electrodes exits in any of the first capacitances $C_{1X}$, $C_{1Y}$, and $C_{1Z}$. Similarly, the self-diagnostic circuit 40 performs the diagnosis on whether or not the level of the first signals proportional to the capacitance values of the first capacitances $C_{3X}$, $C_{3Y}$, and $C_{3Z}$ to which the voltages of ±Vs are applied are within a preset range between the threshold value 1(−) and a threshold value 2(−) shown in FIG. 10. When clearing the diagnosis in the step 9 shown in FIG. 9, the process returns to the step 2 to restart the sensing.

When the self-diagnostic circuit 40 diagnoses the state as abnormal, the caution signal from the self-diagnostic circuit 40 is transferred (step 11) from the physical quantity sensor (ACC) 1 to the inertial measurement unit (IMU) 100 via the register 24 and the serial interface 26. Further, the caution signal is transferred (step 12) from the inertial measurement unit (IMU) 100 to the user-side external equipment 200. Further, when the self-diagnostic circuit 40 diagnoses the state as abnormal, the inertial measurement unit (IMU) 100 is powered off (step 13) to terminate the overall operation.

3. Electronic Apparatus, Vehicle

Figure 11:
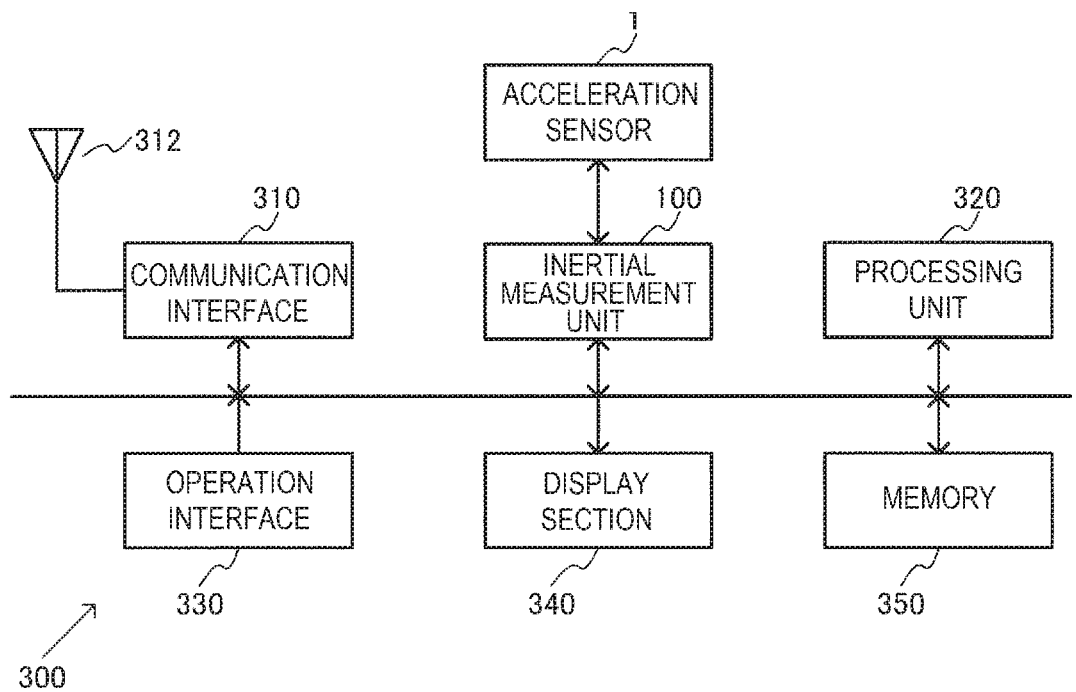
FIG. 11 is a block diagram of an electronic apparatus according to another embodiment.

FIG. 11 is a block diagram showing a configuration example of an electronic apparatus 300 according to the present embodiment. The electronic apparatus 300 includes the inertial measurement unit 100 coupled to the physical quantity sensor 1 according to the embodiment described above, and a processing unit 320 for performing processing based on the measurement result of the inertial measurement unit 100. Further, the electronic apparatus 300 can include a communication interface 310, an operation interface 330, a display section 340, a memory 350, and an antenna 312.

The communication interface 310 is, for example, a wireless circuit, and performs a process of receiving data from the outside and transmitting data to the outside via the antenna 312. The processing unit 320 performs a control process of the electronic apparatus 300, a variety of types of digital processing of the data transmitted or received via the communication interface 310, and the like. Further, the processing unit 320 performs the processing based on the measurement result of the inertial measurement unit 100. Specifically, the processing unit 320 performs signal processing such as a correction process or a filter process on the output signal as the measurement result of the inertial measurement unit 100, or performs a variety of control processes with respect to the electronic apparatus 300 based on the output signal. The function of the processing unit 320 can be realized by a processor such as an MPU or a CPU. The operation interface 330 is for the user to perform an input operation, and can be realized by operation buttons, a touch panel display, or the like. The display section 340 is for displaying a variety of types of information, and can be realized by a display using a liquid crystal, an organic EL, or the like. The memory 350 is for storing the data, and the function thereof can be realized by a semiconductor memory such as a RAM or a ROM, or the like.

It should be noted that the electronic apparatus 300 according to the present embodiment can be applied to a variety of equipment such as an in-car apparatus, a video-related apparatus such as a digital still camera or a video camera, a wearable apparatus such as a head-mounted display device or a timepiece-related apparatus, an inkjet-type ejection device, a robot, a personal computer, a portable information terminal, a printer, a projection apparatus, a medical instrument, or a measurement instrument. The in-car apparatus is a car navigation system, an apparatus for automated driving, or the like. The timepiece-related apparatus is a timepiece, a smart watch, or the like. As the inkjet-type ejection device, there can be cited an inkjet printer and so on. The portable information terminal is a smartphone, a cellular phone, a portable gaming device, a notebook PC, a tablet terminal, or the like.

Figure 12:
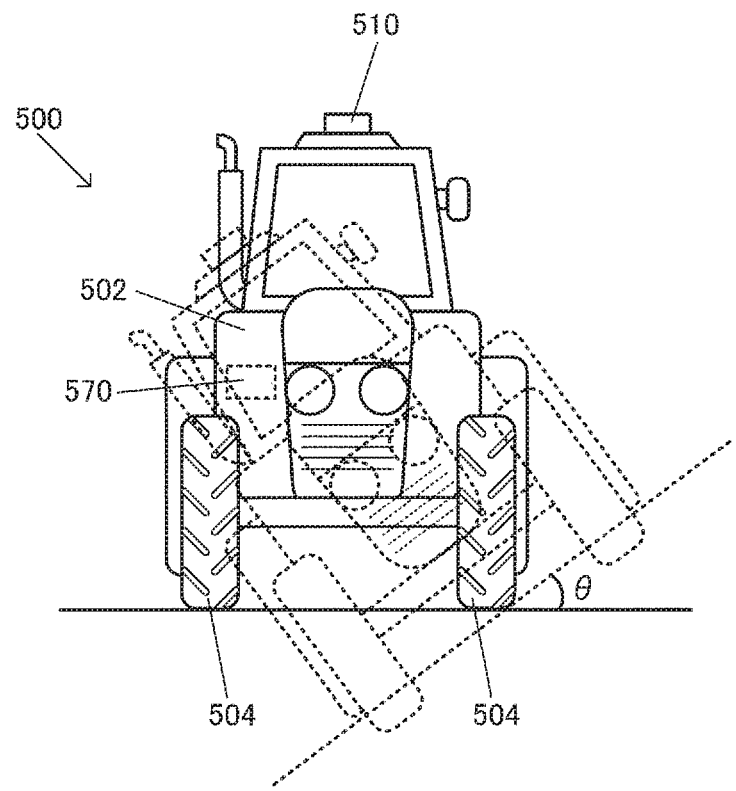
FIG. 12 is a diagram showing an example of a vehicle according to still another embodiment.
Figure 13:
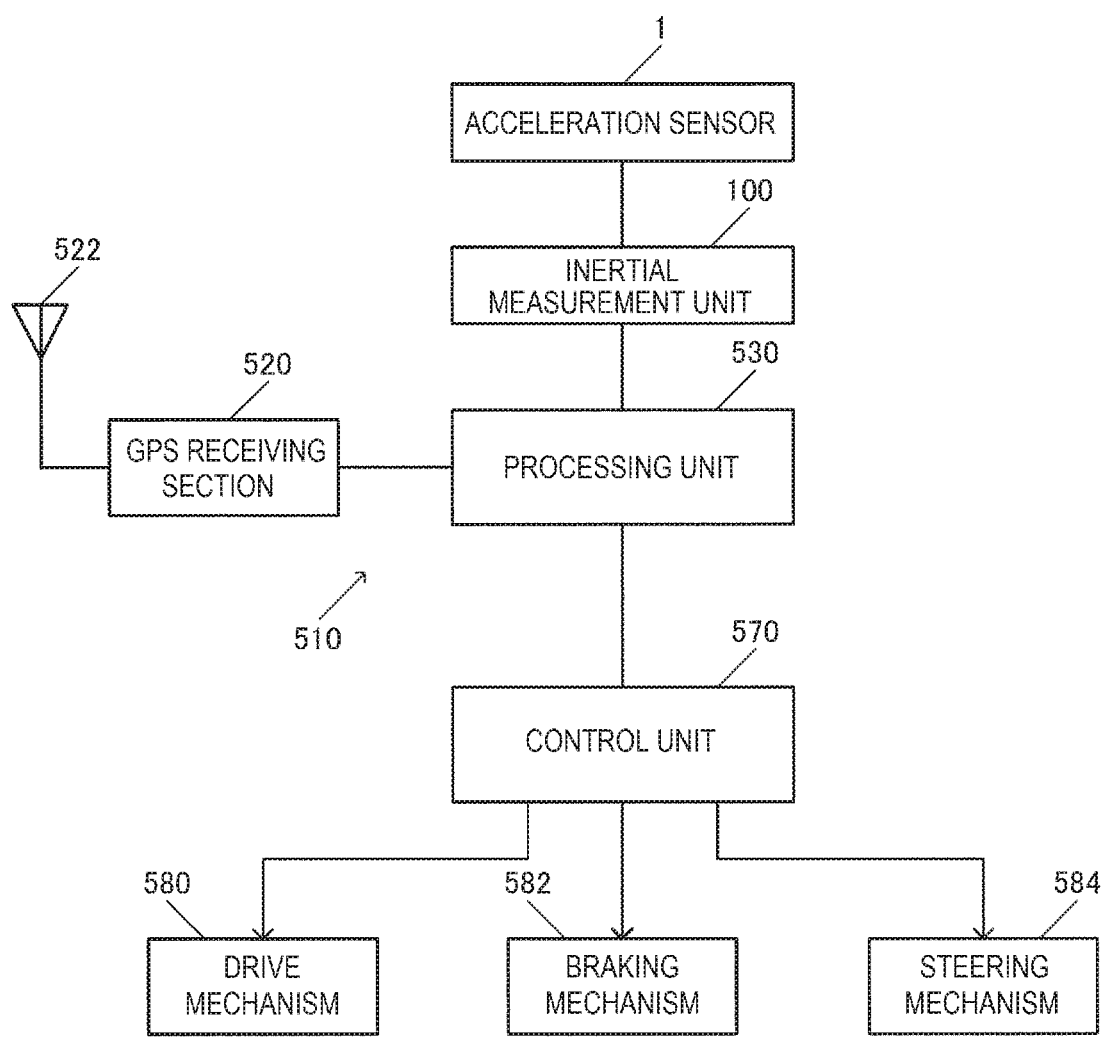
FIG. 13 is a block diagram showing a configuration example of the vehicle.

FIG. 12 shows an example of a vehicle 500 in which the inertial measurement unit 100 according to the present embodiment is used. FIG. 13 is a block diagram showing a configuration example of the vehicle 500. As shown in FIG. 13, the vehicle 500 according to the present embodiment includes the inertial measurement unit 100 and a processing unit 530 for performing processing based on the measurement result of the inertial measurement unit 100.

Specifically, as shown in FIG. 12, the vehicle 500 has a car body 502 and wheels 504. Further, a positioning unit 510 is installed in the vehicle 500. Further, a control unit 570 for performing vehicle control and so on is disposed inside the vehicle 500. Further, as shown in FIG. 13, the vehicle 500 has a drive mechanism 580 such as an engine or a motor, a braking mechanism 582 such as a disk brake or a drum brake, and a steering mechanism 584 realized by a steering wheel, a steering gearbox, and the like. As described above, the vehicle 500 is an apparatus or a unit which is provided with the drive mechanism 580, the braking mechanism 582, and the steering mechanism 584, and moves on the land, in the air, or on the sea. It should be noted that as the vehicle 500, there can be cited an automobile such as a four-wheeled vehicle or a motor bike, a bicycle, an electric train, an airplane, a ship, and so on, but in the present embodiment, the description will be presented citing the four-wheeled vehicle as an example.

The positioning unit 510 is a unit which is installed in the vehicle 500 to perform the positioning of the vehicle 500. The positioning unit 510 includes the inertial measurement unit 100 and the processing unit 530. Further, it is possible for the positioning unit 510 to include a GPS receiving section 520 and an antenna 522. The processing unit 530 as a host device receives acceleration data and angular velocity data as the measurement result of the inertial measurement unit 100, and then performs the inertial navigation arithmetic processing on these data to output inertial navigation positioning data. The inertial navigation positioning data is data representing the acceleration and the attitude of the vehicle 500.

The GPS receiving section 520 receives a signal from a GPS satellite via the antenna 522. The processing unit 530 obtains the GPS positioning data representing the position, the speed, and the azimuth of the vehicle 500 based on the signal received by the GPS receiving section 520. Further, the processing unit 530 calculates what position on the land the vehicle 500 is running using the inertial navigation positioning data and the GPS positioning data. For example, even when the position of the vehicle 500 included in the GPS positioning data is the same, when the attitude of the vehicle 500 is different due to the influence of the tilt (θ) of the land and so on as shown in FIG. 12, it results in that the vehicle 500 is running at a different position on the land. Therefore, it is unachievable to calculate the accurate position of the vehicle 500 with the GPS positioning data alone. Therefore, the processing unit 530 calculates what position on the land the vehicle 500 is running using in particular the data related to the attitude of the vehicle 500 out of the inertial navigation positioning data.

The control unit 570 performs the control of the drive mechanism 580, the braking mechanism 582, and the steering mechanism 584 of the vehicle 500. The control unit 570 is a controller for the vehicle control, and performs a variety of types of control such as the vehicle control and the automated driving control.

The vehicle 500 according to the present embodiment includes the inertial measurement unit 100 and the processing unit 530. The processing unit 530 performs a variety of processes as described above to obtain the information of the position and the attitude of the vehicle 500 based on the measurement result from the inertial measurement unit 100. For example, the information of the position of the vehicle 500 can be obtained based on the GPS positioning data and the inertial navigation positioning data as described above. Further, the information of the attitude of the vehicle 500 can be obtained based on, for example, the angular velocity data included in the inertial navigation positioning data. Further, the control unit 570 performs the control of the attitude of the vehicle 500 based on the information of the attitude of the vehicle 500 obtained by, for example, the processing by the processing unit 530. This control of the attitude can be realized by, for example, the control unit 570 controlling the steering mechanism 584. Alternatively, in the control such as slip control for stabilizing the attitude of the vehicle 500, it is possible for the control unit 570 to control the drive mechanism 580 or to control the braking mechanism 582. According to the present embodiment, since it is possible to accurately obtain the information of the attitude obtained by the output signal of the inertial measurement unit 100, it is possible to realize the appropriate attitude control and so on of the vehicle 500. Further, in the present embodiment, the automated driving control of the vehicle 500 can also be realized. In this automated driving control, there are used the monitoring result of a surrounding object, map information, driving route information, and so on in addition to the information of the position and attitude of the vehicle 500.

4. Conclusion of Embodiments

As described above, the physical quantity sensor 1 according to the present embodiment has the first element section which includes the first capacitances $C_{1X}$, $C_{3X}$, $C_{1Y}$, $C_{3Y}$, $C_{1Z}$, and $C_{3Z}$ varying in accordance with the physical quantity, and in which the first capacitances have the first saturation capacitance values ($C_{1XS}$ in FIG. 3 and FIG. 4) at which the first capacitances are saturated by the first physical quantity, the second element section which includes the second capacitances $C_{2X}$, $C_{4X}$, $C_{2Y}$, $C_{4Y}$, $C_{2Z}$, and $C_{4Z}$ varying in accordance with the physical quantity, and in which the second capacitances have the second saturation capacitance values ($C_{2XS}$ in FIG. 3 and FIG. 4) at which the second capacitances are saturated by the second physical quantity smaller in absolute value than the first physical quantity, the drive circuit 28 for outputting the drive signal DRV to the first element section and the second element section, the multiplexer 10 for outputting the first signals (the signals from the terminals XP1, XN1, YP1, YN1, ZP1, and ZN1 shown in FIG. 2 or FIG. 5) from the first element section and the second signals (the signals from the terminals XP2, XN2, YP2, YN2, ZP2, and ZN2 shown in FIG. 2 or FIG. 5) from the second element section in a time-sharing manner, and the determination circuit 30 of taking the level of the second signal when the second physical quantity has acted as the threshold value (the threshold value 1(+) or the threshold value 1(−) shown in FIG. 10) to determine whether or not the level of the second signal input via the multiplexer has reached the threshold value.

According to the present embodiment, in the present embodiment, while the physical quantity sensor 1 is collecting a first signal for detecting the physical quantity from the first element section, the second signal to be the monitor signal for monitoring whether or not the first element section is abnormal can be collected from the second element section. Based on the second signal to be the monitor signal, the situation of the element sections 2 can be determined by the physical quantity sensor 1 alone.

In the present embodiment, the absolute value of the second physical quantity can be made to be 50 through 90% of the absolute value of the first physical quantity. It is conceivable that in the range in which the absolute value is 50 through 90% of the absolute value of the largest detectable first physical quantity in specification, more preferably, the range in which the absolute value is 60 through 90% of the absolute value of the first physical quantity, the use is relatively low in frequency, and is momentary if any. When it is determined that the magnitude of the physical quantity acting is out of the ordinary use range such as reaching the second physical quantity, the self-diagnosis is requested to the user side. Thus, it is possible to reduce the negative effect that the chances for vainly performing the self-diagnosis are excessively frequently set, and further more, it is possible to request the user side for the self-diagnosis when the necessity is high.

In the present embodiment, it is possible for the first signal and the second signal to be the same in absolute value of the level as each other and opposite in sign to each other to form the differential signal pair. In other words, the physical quantity sensor 1 can be a differential capacitance-type sensor as shown in FIG. 2.

In the present embodiment, the second signal can be the signal proportional to the combined capacitance of the first capacitance and the second capacitance as shown in FIG. 2. Besides the above, the second signal can be the signal proportional to the second capacitance as a single capacitance as shown in FIG. 5.

In the present embodiment, it is possible for the drive circuit 28 to stop outputting the drive signal DRV when the level of the second signal reaches the threshold value. Thus, it is possible to promptly stop the drive of the element sections suspected to be abnormal. Further, it is possible to stop the drive circuit 28 to prepare for a subsequent self-diagnosis.

In the present embodiment, it is possible for the physical quantity sensor 1 to further be provided with an interface circuit such as the serial interface 26 (hereinafter referred to as the interface circuit 26), and it is possible for the interface circuit 26 to output the determination result when the signal from the second element section has reached the threshold value based on the determination signal WD from the determination circuit 30. Thus, it is possible for the physical quantity sensor 1 to prompt the user-side external equipment 200 equipped with the physical quantity sensor 1 for the request from the user-side external equipment 200 for making the physical quantity sensor 1 perform the self-diagnosis.

In the present embodiment, it is possible for the physical quantity sensor 1 to further be provided with the self-diagnostic circuit 40 for performing the self-diagnosis of the first element section, and it is possible for the self-diagnostic circuit 40 to generate the test signals TSTP, TSTN to be input to the first element section, and then diagnose presence or absence of the abnormality in the first element section based on the signal output from the first element section in response to the test signals. Thus, it is possible for the self-diagnostic circuit 40 to drive the first element section while keeping the drive circuit 28 stopped using the test signals TSTP, TSTN generated for itself to thereby perform the self-diagnosis of the first element section.

In the present embodiment, it is possible for the interface circuit 26 to output the caution signal when the self-diagnostic circuit 40 has determined the abnormality. Due to the caution signal, it is possible for the user-side external equipment 200 and so on equipped with the physical quantity sensor 1 to immediately obtain the information that the physical quantity sensor 1 cannot operate.

In the present embodiment, it is possible for the self-diagnostic circuit 40 to operate based on a command input to the interface circuit 26. Alternatively, it is possible for the physical quantity sensor 1 to further be provided with the external terminal OT, and it is possible for the self-diagnostic circuit 40 to operate based on the trigger signal input to the external terminal OT. In particular, when the physical quantity sensor 1 is installed in the user-side external equipment 200 to detect the physical quantity acting on the user-side external equipment 200 which is in motion, it is necessary to stop the motion of the user-side external equipment 200 when performing the self-diagnosis. Therefore, when the self-diagnostic circuit 40 operates in accordance with the command or the trigger signal from the outside, it is possible to ensure the external environment for the self-diagnosis which cannot be arranged by the physical quantity sensor 1 alone.

It should be noted that the physical quantity detection circuit 3 is a device which incorporates the A/D conversion circuit (ADC) 20 to thereby perform digital output in the present embodiment, but can be a device which performs analog output. In this case, the determination circuit 30 and the self-diagnostic circuit 40 can be provided with an analog comparator, or can also be provided with a digital comparator for comparing a signal on which the A/D conversion has been performed.

The electronic apparatus according to the present embodiment can be provided with the physical quantity sensor 1 described above, and a control section for performing the control based on the detection signal output from the physical quantity sensor. By reducing the chance that the physical quantity sensor 1 having an abnormality in the element sections continues to be used, the error in the detection signal from the physical quantity sensor 1 is reduced, and thus, the reliability of the control of the electronic apparatus is enhanced.

The vehicle according to the present embodiment can be provided with the physical quantity sensor 1 described above, and an attitude control section for performing the control of the attitude based on the detection signal output from the physical quantity sensor 1. By reducing the chance that the physical quantity sensor 1 having an abnormality in the element sections continues to be used, the error in the detection signal from the physical quantity sensor 1 is reduced, and thus, the reliability of the attitude control of the vehicle is enhanced.

What is claimed is:

1. A physical quantity sensor comprising:
   a first element section which includes a first capacitance varying in accordance with a physical quantity, and in which the first capacitance has a first saturation capacitance value at which the first capacitance is saturated by a first physical quantity;
   a second element section which includes a second capacitance varying in accordance with the physical quantity, and in which the second capacitance has a second saturation capacitance value at which the second capacitance is saturated by a second physical quantity smaller in absolute value than the first physical quantity;
   a drive circuit configured to output a drive signal to the first element section and the second element section;
   a multiplexer configured to output a first signal from the first element section and a second signal from the second element section; and
   a determination circuit that determines whether or not the level of the second signal input via the multiplexer reaches a threshold value which is a level of the second signal when the second physical quantity acts.

2. The physical quantity sensor according to claim 1, wherein
   the absolute value of the second physical quantity is 50 through 90% of the absolute value of the first physical quantity.

3. The physical quantity sensor according to claim 1, wherein
   the first signal and the second signal are same in absolute value of level as each other and opposite in sign to each other to form a differential signal pair.

4. The physical quantity sensor according to claim 1, wherein
   the second signal is a signal proportional to a combined capacitance of the first capacitance and the second capacitance.

5. The physical quantity sensor according to claim 1, wherein
   the drive circuit stops outputting the drive signal when the level of the second signal reaches the threshold value.

6. The physical quantity sensor according to claim 1, further comprising:
   an interface circuit, wherein
   the interface circuit outputs a determination result when a signal from the second element section reaches the threshold value based on a determination signal from the determination circuit.

7. The physical quantity sensor according to claim 6, further comprising:
- a self-diagnostic circuit configured to perform a self-diagnosis of the first element section, wherein
- the self-diagnostic circuit generates a test signal to be input to the first element section, and then diagnoses presence or absence of an abnormality in the first element section based on a signal output from the first element section in response to the test signal.

8. The physical quantity sensor according to claim 7, wherein
- the interface circuit outputs a caution signal when the self-diagnostic circuit determines an abnormality.

9. The physical quantity sensor according to claim 7, wherein
- the self-diagnostic circuit operates based on a command input to the interface circuit.

10. The physical quantity sensor according to claim 7, further comprising:
- an external terminal, wherein
- the self-diagnostic circuit operates based on a trigger signal input to the external terminal.

11. An electronic apparatus comprising the physical quantity sensor according to claim 1.

12. A vehicle comprising the physical quantity sensor according to claim 1.

* * * * *